(12) United States Patent
Lopez

(10) Patent No.: US 10,090,436 B2
(45) Date of Patent: Oct. 2, 2018

(54) SEMICONDUCTOR LIGHT EMITTING DEVICE WITH SHAPED SUBSTRATE AND METHOD OF MANUFACTURING THE SAME

(71) Applicant: KONINKLIJKE PHILIPS N.V., Eindhoven (NL)

(72) Inventor: Toni Lopez, Aachen (DE)

(73) Assignee: Lumileds LLC, San Jose, CA (US)

( * ) Notice: Subject to any disclaimer, the term of this patent is extended or adjusted under 35 U.S.C. 154(b) by 146 days.

(21) Appl. No.: 15/108,922

(22) PCT Filed: Dec. 12, 2014

(86) PCT No.: PCT/IB2014/066831
§ 371 (c)(1),
(2) Date: Jun. 29, 2016

(87) PCT Pub. No.: WO2015/101854
PCT Pub. Date: Jul. 9, 2015

(65) Prior Publication Data
US 2016/0329464 A1     Nov. 10, 2016

Related U.S. Application Data

(60) Provisional application No. 61/923,908, filed on Jan. 6, 2014.

(51) Int. Cl.
*H01L 33/20* (2010.01)
*H01L 33/00* (2010.01)
(Continued)

(52) U.S. Cl.
CPC ............ *H01L 33/20* (2013.01); *H01L 33/007* (2013.01); *H01L 33/0079* (2013.01);
(Continued)

(58) Field of Classification Search
CPC .............. H01L 25/0753; H01L 33/007; H01L 33/0079; H01L 33/20; H01L 33/22;
(Continued)

(56) References Cited

U.S. PATENT DOCUMENTS

| 5,218,223 A | 6/1993 | Spaeth et al. |
| 2006/0202219 A1* | 9/2006 | Ohashi ............... H01L 33/20 257/98 |

(Continued)

FOREIGN PATENT DOCUMENTS

| CN | 101720513 A | 6/2010 |
| CN | 102931318 A | 2/2013 |

(Continued)

OTHER PUBLICATIONS

EPO as ISA, International Search Report and Written Opinion dated Feb. 19, 2015 from International Application No. PCT/IB2014/066831, filed Dec. 12, 2014, 15 pages.

(Continued)

*Primary Examiner* — Joseph Galvin, III

(57) ABSTRACT

Embodiments of the invention include a substrate (10) and a semiconductor structure (12) grown on the substrate. The semiconductor structure includes a light emitting layer (18) disposed between an n-type region (16) and a p-type region (20). The substrate includes a first sidewall (30) and a second sidewall (32). The first sidewall and second sidewall are disposed at different angles relative to a major surface of the semiconductor structure. A reflective layer (34) is disposed over the first sidewall (30).

18 Claims, 3 Drawing Sheets

(51) Int. Cl.
  *H01L 33/22* (2010.01)
  *H01L 33/46* (2010.01)
  *H01L 25/075* (2006.01)
  *H01L 33/48* (2010.01)
  *H01L 33/50* (2010.01)

(52) U.S. Cl.
  CPC .............. *H01L 33/22* (2013.01); *H01L 33/46* (2013.01); *H01L 33/505* (2013.01); *H01L 25/0753* (2013.01); *H01L 33/486* (2013.01); *H01L 33/50* (2013.01); *H01L 2924/0002* (2013.01)

(58) Field of Classification Search
  CPC ....... H01L 33/46; H01L 33/486; H01L 33/50; H01L 33/505
  See application file for complete search history.

(56) References Cited

U.S. PATENT DOCUMENTS

| | | | | |
|---|---|---|---|---|
| 2010/0117111 | A1* | 5/2010 | Illek | H01L 33/382 |
| | | | | 257/98 |
| 2011/0121319 | A1* | 5/2011 | Haase | H01L 33/08 |
| | | | | 257/78 |
| 2011/0254039 | A1* | 10/2011 | Kim | H01L 33/46 |
| | | | | 257/98 |
| 2011/0291145 | A1 | 12/2011 | Han et al. | |
| 2011/0316023 | A1* | 12/2011 | Yeh | H01L 33/46 |
| | | | | 257/98 |
| 2013/0260490 | A1* | 10/2013 | Shatalov | H01L 33/20 |
| | | | | 438/27 |

FOREIGN PATENT DOCUMENTS

| | | |
|---|---|---|
| EP | 1411557 A2 | 4/2004 |
| EP | 1569283 A1 | 8/2005 |
| EP | 2246913 A2 | 11/2010 |
| JP | 2002197903 A | 7/2002 |

OTHER PUBLICATIONS

First Office Action dated Mar. 19, 2018, China Patent Application No. 201480072447.8, 21 pages.

Office Action dated Mar. 12, 2018, Taiwan Patent Application No. 104100090, 13 pages.

* cited by examiner

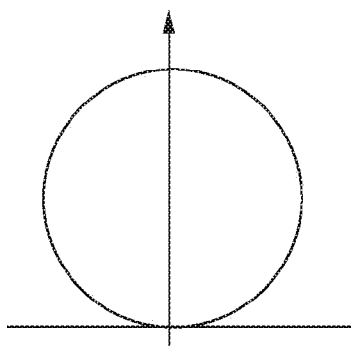
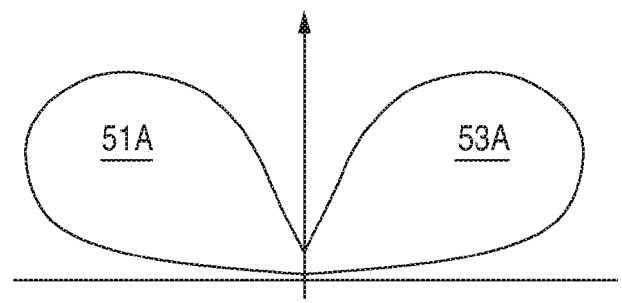
FIG. 7     FIG. 8
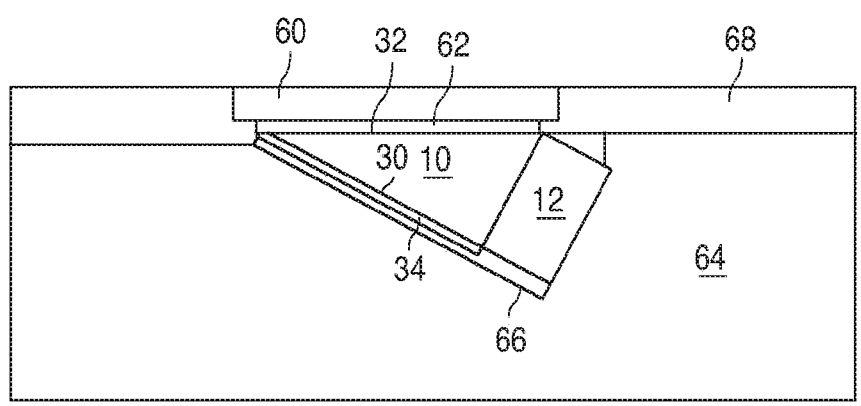
FIG. 9
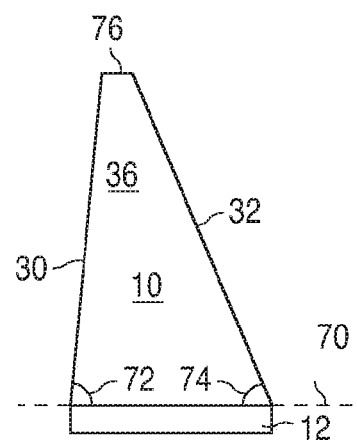
FIG. 10

SEMICONDUCTOR LIGHT EMITTING DEVICE WITH SHAPED SUBSTRATE AND METHOD OF MANUFACTURING THE SAME

CROSS-REFERENCE TO RELATED APPLICATIONS

The present application is a § 371 application of International Application No. PCT/IB2014/066831 filed on Dec. 12, 2014 and entitled "SEMICONDUCTOR LIGHT EMITTING DEVICE WITH SHAPED SUBSTRATE AND METHOD OF MANUFACTURING THE SAME," which claims priority to U.S. Provisional Application No. 61/923,908, filed Jan. 6, 2014. International Application No. PCT/IB2014/066831 and U.S. Provisional Application No. 61/923,908 are incorporated herein.

FIELD OF THE INVENTION

The present invention relates to a semiconductor light emitting device that may have improved light extraction.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a known LED. After growth of the epitaxial structure on the growth substrate 2, metal contacts are formed on the epitaxial structure, and the device is flipped over relative to the growth direction and attached to a mount 5. In FIG. 1, the epitaxial structure and metal contacts are shown as block 3. A phosphor layer 4 is formed over the substrate 2. Phosphor layer 4 absorbs light emitted by the light emitting layer of the epitaxial structure and emits light of a different wavelength. A lens 6 is disposed over the LED and the mount 5.

In the device illustrated in FIG. 1, a majority of the light extracted from the LED is extracted from the substrate side (as opposed to the epitaxial structure side). Light emitted by the light emitting layer toward the metal contacts may be partially reflected by a reflective p-contact, before exiting the structure. The p-contact may cover some portion of the epitaxial structure surface opposite the substrate. The phosphor generally emits light in all directions. Some light 8 absorbed by the phosphor and emitted at a different wavelength is emitted in the direction of lens 6. Some light 9 emitted by the phosphor is emitted back toward the epitaxial structure 3. Because the epitaxial structure 3 is not very reflective, light 9 is likely to be absorbed, which reduces the efficiency of the device of FIG. 1.

SUMMARY

It is an object of the invention to provide a device that may reduce absorption of light by the epitaxial structure.

Embodiments of the invention include a substrate and a semiconductor structure grown on the substrate. The semiconductor structure includes a light emitting layer disposed between an n-type region and a p-type region. The substrate includes a first sidewall and a second sidewall. The first sidewall and second sidewall are disposed at different angles relative to a major surface of the semiconductor structure. A reflective layer is disposed over the first sidewall.

A method according to embodiments of the invention includes growing a semiconductor structure on a substrate, the semiconductor structure including a III-nitride light emitting layer disposed between an n-type region and a p-type region. The method further includes shaping the substrate to form a first sidewall and a second sidewall. The first sidewall and second sidewall are disposed at different angles relative to a major surface of the semiconductor structure. A reflective layer is formed over the first sidewall.

BRIEF DESCRIPTION OF THE DRAWINGS

FIG. 7 illustrates the far-field emission pattern of the structure illustrated in FIG. 1.

FIG. 8 illustrates the far-field emission pattern of the structure illustrated in FIG. 6.

FIG. 9 is a cross sectional view of a device with a shaped growth substrate disposed in a shaped opening in a mount.

FIG. 10 is a cross sectional view of a device with a shaped growth substrate.

DETAILED DESCRIPTION

In embodiments of the invention, the growth substrate is shaped to reduce the amount of light that is directed toward the epitaxial structure.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
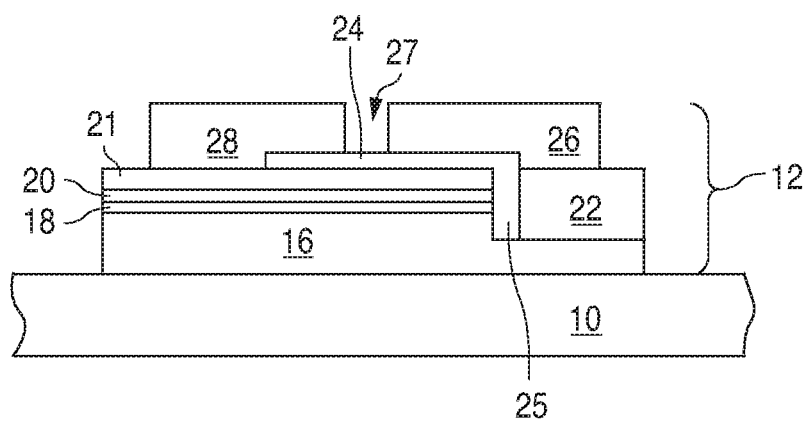
FIG. 2 illustrates one example of a III-nitride LED.

FIG. 2 illustrates a III-nitride LED that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure 12 on a growth substrate 10 as is known in the art. The growth substrate is often sapphire but may be any suitable substrate such as, for example, a non-III-nitride material, sapphire, SiC, Si, GaN, or a composite substrate. A surface of the growth substrate on which the III-nitride semiconductor structure is grown may be patterned, roughened, or textured before growth, which may improve light extraction into the substrate.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED, one or more interconnects 26 and 28 are formed on or electrically connected to the n- and p-contacts 22 and 21. Interconnect 26 is electrically connected to n-contact 22 in FIG. 2. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single growth substrate wafer then diced from the wafer of devices. The semiconductor structure, the n- and p-contacts 22 and 21, and the interconnects 26 and 28 are represented in the figures below by block 12.

Figure 3:
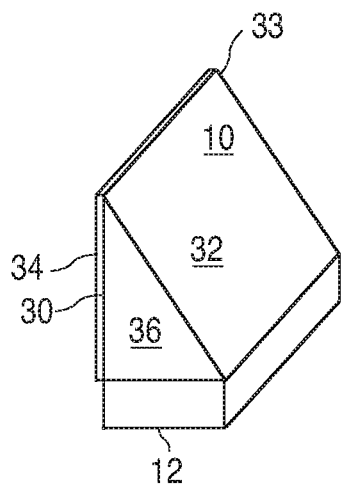
FIG. 3 illustrates a device with a shaped growth substrate.
Figure 4:
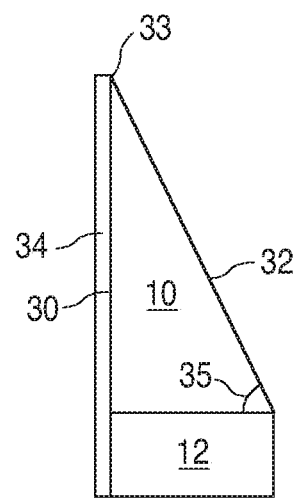
FIG. 4 is a cross sectional view of the device illustrated in FIG. 3.

FIG. 3 illustrates a device with a shaped growth substrate, according to embodiments of the invention. FIG. 4 is a cross sectional view of the device illustrated in FIG. 3. The device illustrated in FIG. 3 may be diced from the growth substrate wafer such that the epitaxial structure 12 is rectangular. Along one of the long edges of the rectangular epitaxial structure 12, the growth substrate 10 is shaped into a substantially vertical sidewall 30. Along the other long edge of the rectangular epitaxial structure 12, the growth substrate 10 is shaped into and a sloped sidewall 32. Sloped sidewall 32 may be sloped so that it meets substantially vertical sidewall 30 at a vertex 33 at the top of growth substrate 10. In the cross section illustrated in FIG. 4, the vertical sidewall 30 and the sloped sidewall 32 make a right triangle with an angle 35 of 60°. The angle 35 of the triangle may be at least 50° in some embodiments and less than or equal to 70° in some embodiments. Along the short edges of the rectangular epitaxial structure, the growth substrate 10 may have substantially vertical sidewalls 36 such that substrate 10 forms a triangular prism. The substrate is not limited to the right triangle shape illustrated in FIGS. 3 and 4 and may be shaped into any suitable shapes and cross sections, including, for example, geometrical shapes such as trapezoidal prisms, other triangles besides right triangles, any sort of prism, and prismatoids. A prism is a polyhedron with an n-sided polygonal base, a translated copy of the base not in the same plane as the base, and n other faces (necessarily all parallelograms) joining corresponding sides of the base and the translated copy of the base. All cross-sections parallel to the base faces are the same. Prisms are named for their base, so a prism with a pentagonal base is called a pentagonal prism. A prismatoid is a polyhedron where all vertices lie in two parallel planes.

The vertical sidewall 30 may be covered with a highly reflective material 34. Vertical sidewalls 36 may be covered with a reflective material such as highly reflective material 34 or a different material. Any suitable reflective material(s) may be used, such as, for example, reflective paint, reflective metals such as Ag or Al, dielectric materials, or white diffusers. In some embodiments, some or all of the sidewalls of the structure 12 are coated with a highly reflective material. Light is extracted from the substrate through the sidewall with the largest area, the sloped sidewall 32 in the embodiment illustrated in FIGS. 3 and 4.

Figure 1:
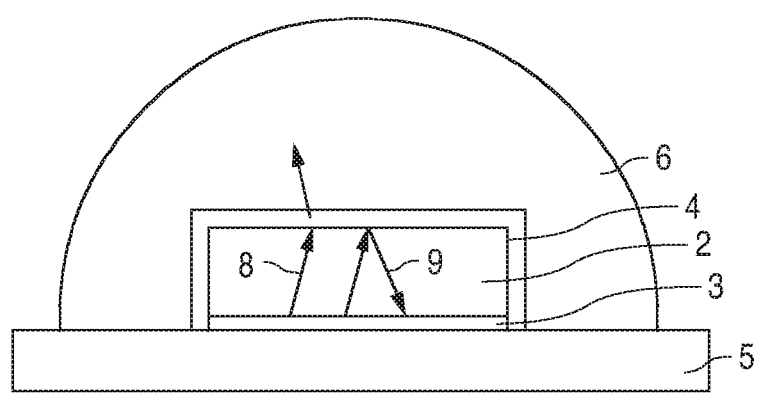
FIG. 1 illustrates a prior art phosphor converted light emitting diode.

A growth substrate that is shaped according to embodiments of the invention may be thicker than a growth substrate in a conventional device, such as the device illustrated in FIG. 1. For example, the growth substrate 10 in FIGS. 3 and 4 may be at least 300 µm thick in some embodiments, no more than 1000 µm thick in some embodiments, at least 500 µm thick in some embodiments, and no more than 800 µm thick in some embodiments.

The substrate 10 may be shaped by any suitable method. For example, the substantially vertical sidewalls 30 and 36 may be formed by dicing the device from the growth substrate wafer. The sloped sidewall 32 may be formed by any suitable technique such as, for example, etching, grinding, laser scribing, ablation, or sub-surface scribing and breaking (sometimes referred to as "stealth" dicing or cutting). In some embodiments, the device 12 is protected during the formation of sloped sidewall 32, for example, by covering it with handling tape or any other suitable material or technique. The sloped sidewall 32 may be formed after the semiconductor structure is grown on the substrate 10 in some embodiments. The sloped sidewall 32 may be formed before or after dicing the device from the growth substrate wafer. In some embodiments, the substrate 10 is thinned before forming sloped sidewall 32.

Figure 5:
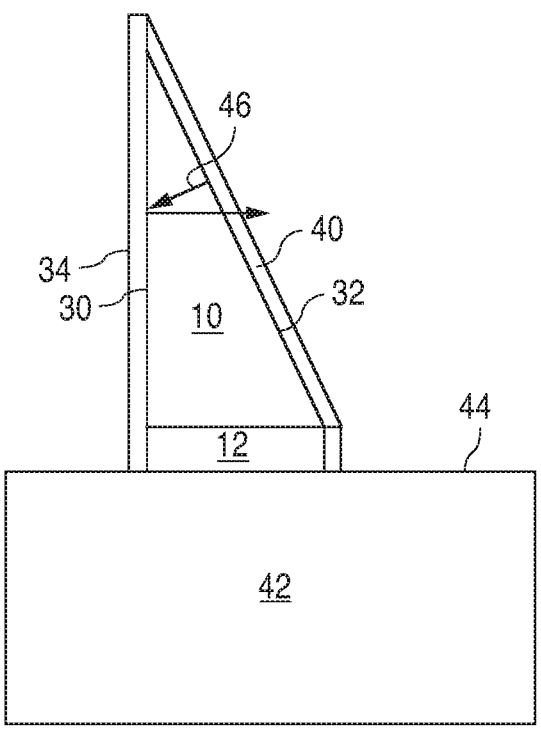
FIG. 5 illustrates a device with a shaped growth substrate and a wavelength converting layer, disposed on a reflective mount.

FIG. 5 illustrates a device with a shaped growth substrate and a wavelength converting layer. The wavelength converting layer 40 is formed on sloped sidewall 32, the surface of the substrate 10 from which light is extracted. Wavelength converting layer 40 may be, for example, wavelength converting layer material formed into a ceramic for example by sintering, then glued to the substrate 10, or a wavelength converting material mixed with a transparent material such as silicone, glass, or epoxy that is disposed on the substrate by any suitable method including, for example, molding, laminating, electrophoretic deposition, spin coating, spray coating, screen printing, or dispensing. Wavelength converting layer 40 is often between 50 and 100 μm thick, though it may be any thickness appropriate to the particular wavelength converting material used and to the particular method used to form the wavelength converting layer.

The wavelength converting material in wavelength converting layer 40 may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

As illustrated by ray 46, light that is emitted by wavelength converting layer 40 into substrate 10 may be reflected by reflective coating 34, then emitted toward wavelength converting layer 40 where the light may escape the device. Light 46 emitted by the wavelength converting layer 40 into substrate 10 is unlikely to encounter the semiconductor structure 12 in the device of FIG. 5, in contrast to the device of FIG. 1, where a significant amount of light emitted by the phosphor into the substrate is absorbed by the poorly reflecting epitaxial structure. Accordingly, shaping the growth substrate may increase the extraction efficiency of the device, by reducing the amount of light generated by the wavelength converting layer 40 that is absorbed by the semiconductor structure.

In some embodiments, devices with shaped growth substrates are disposed on reflective mounts, as illustrated in FIG. 5. The reflective mount 42 may be formed from a reflective material such as a reflective metal, or may be any suitable material with a reflective top surface 44. The top surface may be made reflective by, for example, coating the surface with a reflective metal such as Ag or Al, reflective paint, or any other suitable material.

Figure 6:
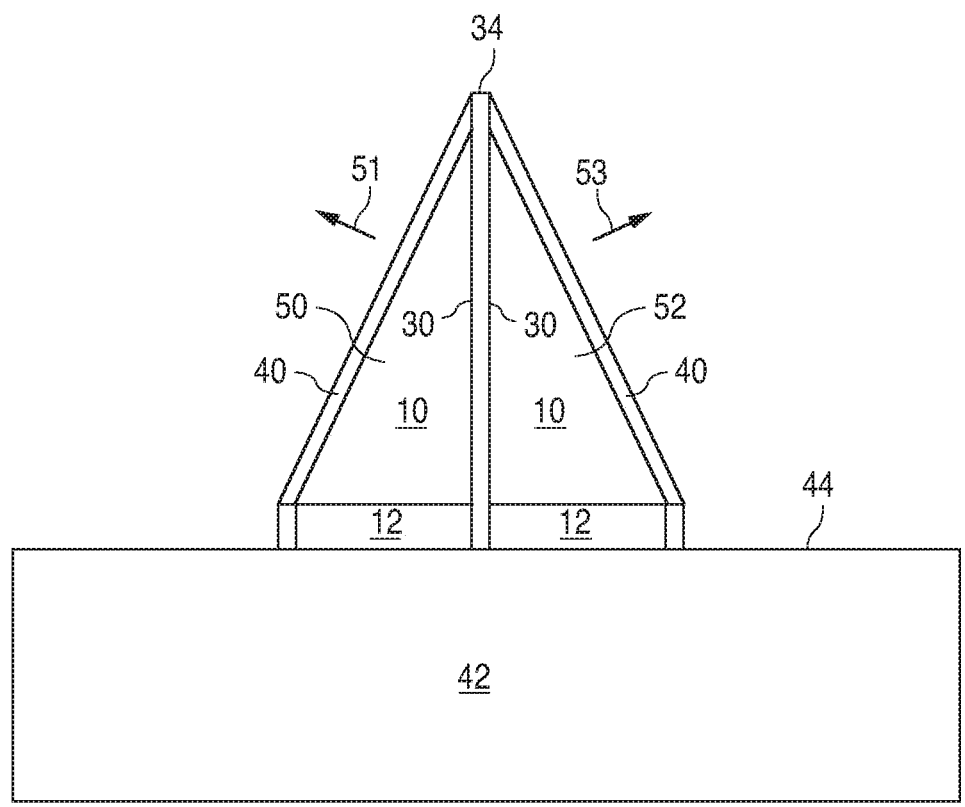
FIG. 6 illustrates two devices with shaped growth substrates disposed on a reflective mount.

Since the device illustrated in FIGS. 3, 4, and 5 emits light through a single sidewall of the substrate 10, (sloped sidewall 32), the light emission is not symmetrical, as in the device of FIG. 1. FIG. 6 illustrates a configuration where two of the devices illustrated in FIG. 5 are disposed on a reflective mount 42, back to back. The reflective coating 34 on the vertical sidewalls 30 of the left side device 50 and the right side device 52 are disposed adjacent each other. Light from the left side device 50 is emitted largely in the direction 51. Light from the right side device 52 is emitted largely in the direction 53.

FIG. 7 illustrates the far-field emission pattern from the device illustrated in FIG. 1. The emission pattern of FIG. 1 is a substantially symmetrical Lambertian pattern. FIG. 8 illustrates the far-field emission pattern from the device illustrated in FIG. 6. The structure of FIG. 6 emits light in two lobes, lobe 51A from the left side device 50 and lobe 53A from right side device 52. The structure of FIG. 6 extracts substantially more light from the sides of the structure than the device of FIG. 1, which extracts substantially more light from the top of the structure. The structure illustrated in FIG. 6 may be beneficial in lighting applications that do not require directionality but rather favor significant side emission, for example to enhance light diffusion.

FIG. 9 illustrates an embodiment which may be suitable for applications requiring directionality of light emission. In the device of FIG. 9, a cavity or opening 66 is formed in a mount 64. The cavity 66 is shaped to accommodate a device with a shaped growth substrate 10, such as the device illustrated in FIG. 3. The shape of cavity 66 may be substantially the same as the shape of the device. For example, cavity 66 may be shaped such that the sidewall 32 is substantially parallel to one of the surfaces of mount 64. In some embodiments, cavity 66 may be shaped so that sidewall 32 is coincident with a surface of mount 64, or inset to accommodate a wavelength converting member. In the alternative, the cavity 66 may be shaped so that sidewall 32 protrudes above a surface of mount 64.

The sidewall 30 of the substrate 10 that is coated with a reflective material 34 is disposed proximate the cavity 66. In some embodiments, one or more of the internal surfaces of cavity 66 are reflective, such that a separate reflective material layer 34 may be omitted. Likewise, if one or more of the internal surfaces of cavity 66 is reflective, a separate reflective material layer may be omitted from sidewalls 36. The sidewall 32 from which light is extracted is disposed substantially even with the top surface of mount 64 (as used in this context, the "top" surface of mount 64 refers to the surface from which the cavity extends). A wavelength converting member 60, which may be, for example, a luminescent ceramic or any other suitable material, may be attached to sidewall 32 by a transparent adhesive layer 62 such as silicone, epoxy, glass, or any other suitable material. Reflective material 68 may be disposed around the wavelength converting member 60. The structure illustrated in FIG. 9 emits a similar far-field pattern as the structure illustrated in FIG. 1. A majority of light is extracted from the structure through the top of the structure in the orientation illustrated in FIG. 9.

In some embodiments, the reflective layer 68 that surrounds the wavelength converting member 60 and/or the mount 64 in the device of FIG. 9 may be made from materials that conduct heat. The mount may be made of any suitable material such as, for example, metal, ceramic, AlN, or silica. In some embodiments, the surface of the mount is coated with any suitable reflective material (not shown in FIG. 9), including, for example, silver metal. Reflective layer 68 may be, for example, any suitable material such as a white reflector paste. The mount 64 and/or reflective layer 68 may conduct heat away from the LED and/or the wavelength converting member 60, which may increase the efficiency of the structure and/or improve the lifetime of the device.

The shape of substrate 10 is not limited to the shapes illustrated in FIGS. 3, 4, 5, 6, and 9. FIG. 10 illustrates the cross section of a shaped substrate 10 according to embodiments of the invention. A plane 70 of the semiconductor structure 12 is illustrated in FIG. 10. In the device of FIG. 4, the sidewall 30 on which a reflective layer is disposed forms a right angle with the equivalent of plane 70. The sidewall 32 from which light is extracted forms an acute angle 35 with the equivalent of plane 70. The substrate 10 of FIG. 4 has four sidewalls and no other surface. Light is extracted from the sidewall 32 which is sidewall with the largest area.

In FIG. 10, the sidewall 30 on which a reflective layer is disposed forms an acute angle 72 with plane 70. The sidewall 32 from which light is extracted forms an acute angle 74 with plane 70. Acute angle 74 is small than acute angle 72 (i.e., sidewall 30 is closer to vertical than sidewall 32). In other words, sidewall 30 is arranged at a different angle relative to major plane 70 than sidewall 32 (this is also the case for the device of FIG. 4). As in FIG. 4, in the device of FIG. 10, light is extracted from the sidewall 32. In some embodiments, the sidewall from which light is extracted is the sidewall with the largest area.

The substrate illustrated in FIG. 10 also has a top surface 76. Top surface 76 may be coated with a reflective layer. The reflective layer is similar or identical to those described above. Little or no light is extracted from the substrate through top surface 76. The substrate illustrated in FIG. 10 has a top surface and four sidewalls, two long sidewalls 30 and 32 which are opposite each other, and two short sidewalls 36 which are opposite each other. The short sidewalls 36 may be vertical or angled at an acute angle relative to major plane 70. The area of sidewall 32 is larger than the area of top surface 76. Sidewalls 30 and 36 and top surface 76 may be covered with a reflective layer. A wavelength converting layer may be disposed on sidewall 32, as described above.

In some embodiments, in addition to or instead of being coated with a reflective material, the reflective sidewalls of the substrate may be textured, for example by roughening or patterning with a random or repeating pattern, to scatter and/or direct light toward the sidewall 32, from which light is extracted from the substrate.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
a substrate;
a semiconductor structure disposed on the substrate, the semiconductor structure comprising a light emitting layer disposed between an n-type region and a p-type region;
wherein:
the substrate comprises a first sidewall and a second sidewall;
the first sidewall and second sidewall are disposed at different angles relative to a major surface of the semiconductor structure;
the first sidewall forms a right angle with the major surface of the semiconductor structure; and
light is extracted from the substrate through the second sidewall; and
a reflective layer disposed over the first sidewall, the reflective layer extending from the semiconductor structure to an interface between the first sidewall and the second sidewall.

2. The device of claim 1 wherein the second sidewall forms an acute angle with the major surface of the semiconductor structure.

3. The device of claim 1 wherein the second sidewall has a larger area than the first sidewall.

4. A device comprising:
a substrate comprising a first sidewall, a second sidewall, a first long edge, a second long edge, and a short edge connecting the first and second long edges, wherein the first sidewall is disposed along the first long edge and the second sidewall is disposed along the second long edge;
a semiconductor structure disposed on the substrate, the semiconductor structure comprising a light emitting layer disposed between an n-type region and a p-type region, wherein the first sidewall and second sidewall are disposed at different angles relative to a major surface of the semiconductor structure, the first sidewall forms a right angle with the major surface of the semiconductor structure, and light is extracted from the substrate through the second sidewall; and
a reflective layer disposed over the first sidewall, the reflective layer extending from the semiconductor structure to an interface between the first sidewall and the short edge.

5. The device of claim 1 wherein the substrate has a thickness of at least 500 µm.

6. The device of claim 1 further comprising a wavelength converting layer disposed over the second sidewall.

7. A device comprising:
a substrate comprising a first sidewall and a second sidewall;
a semiconductor structure disposed on the substrate, the semiconductor structure comprising a light emitting layer disposed between an n-type region and a p-type region;
wherein:
the first sidewall and second sidewall are disposed at different angles relative to a major surface of the semiconductor structure;
the first sidewall forms a right angle with the major surface of the semiconductor structure; and
the substrate and the semiconductor structure are disposed in a cavity in a mount, wherein the cavity is shaped to accommodate the substrate and the semiconductor structure, and wherein the second sidewall is parallel with a top surface of the mount.

8. The device of claim 7 further comprising:
a wavelength converting layer disposed over the second sidewall; and
a reflective layer disposed on a top surface of the mount surrounding the wavelength converting layer.

9. The device of claim 1 wherein the substrate and the semiconductor structure are a first substrate and a first semiconductor structure, the device further comprising:
a second substrate; and
a second semiconductor structure disposed on the second substrate, the second semiconductor structure comprising a light emitting layer disposed between an n-type region and a p-type region;
wherein:
the second substrate comprises a third sidewall and a fourth sidewall;
the fourth sidewall and fourth sidewall are disposed at different angles relative to a major surface of the second semiconductor structure; and
the first sidewall of the first substrate faces the third sidewall of the second substrate.

10. The device of claim 1 wherein the first sidewall is textured.

11. The device of claim 1 wherein the first and second sidewall form part of a prismatoid.

12. A method comprising:
   growing a semiconductor structure on a substrate, the semiconductor structure comprising a III-nitride light emitting layer disposed between an n-type region and a p-type region;
   shaping the substrate to form a first sidewall and a second sidewall, wherein the first sidewall and the second sidewall are disposed at different angles relative to a major surface of the semiconductor structure, wherein the first sidewall forms a right angle with the major surface of the semiconductor structure; and
   forming a reflective layer over the first sidewall extending from the semiconductor structure to an interface between the first sidewall and the second sidewall wherein light is extracted from the substrate through the second sidewall.

13. The method of claim 12 wherein shaping comprises etching the substrate after growing the semiconductor structure.

14. The method of claim 12 further comprising texturing the first sidewall.

15. The device of claim 4 wherein the substrate has a thickness of at least 500 µm.

16. The device of claim 4 further comprising a wavelength converting layer disposed over the second sidewall.

17. The device of claim 4 wherein the first sidewall is textured.

18. The device of claim 7 further comprising a reflective layer disposed on the first sidewall.

* * * * *